(12) United States Patent
Nito

(10) Patent No.: US 7,804,335 B2
(45) Date of Patent: Sep. 28, 2010

(54) ALTERNATING CURRENT LEVEL DETECTION CIRCUIT

(75) Inventor: Yoshiharu Nito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 12/174,906

(22) Filed: Jul. 17, 2008

(65) Prior Publication Data

US 2009/0027111 A1    Jan. 29, 2009

(30) Foreign Application Priority Data

Jul. 17, 2007 (JP) ............................... 2007-186264

(51) Int. Cl.
H03K 17/14 (2006.01)
H03K 5/22 (2006.01)
G05F 3/26 (2006.01)

(52) U.S. Cl. .......................... 327/83; 327/104; 327/538

(58) Field of Classification Search .................. None
See application file for complete search history.

(56) References Cited

U.S. PATENT DOCUMENTS 5,721,507 A * 2/1998 Fujii et al. .................. 327/354
6,204,980 B1   3/2001 Momtaz et al.
6,590,437 B2   7/2003 Imai
6,891,407 B2 * 5/2005 Kobayashi et al. ............ 327/77

FOREIGN PATENT DOCUMENTS

JP    2001-142552    5/2001

* cited by examiner

*Primary Examiner*—Lincoln Donovan
*Assistant Examiner*—Terry L Englund
(74) *Attorney, Agent, or Firm*—Turocy & Watson, LLP

(57) ABSTRACT

A detection circuit includes a current source with no temperature coefficient; a current generation circuit that generates a VBE proportional reference current from the current source with no temperature coefficient; a current mirror circuit that returns an output current of the current generation circuit; a reference voltage generation circuit that generates a VBE proportional voltage with a negative temperature coefficient on the basis of the current returned by the current mirror circuit so that the VBE proportional voltage is used as a reference voltage of a comparator; and a full-wave rectifying means, having a differential pair and a rectifier circuit, using the current source with no temperature coefficient, having an alternating current signal supplied as an input signal, for generating a direct current voltage with a negative coefficient on the basis of a voltage obtained by full-wave rectifying the alternating current signal, and for using the generated voltage as a comparative voltage of the comparator.

8 Claims, 8 Drawing Sheets

10: VT PROPORTIONAL CURRENT SOURCE
20: CURRENT SOURCE WITH NO TEMPERATURE COEFFICIENT
30: CIRCUIT BLOCK
100: DETECTION CIRCUIT
600: CURRENT SOURCE BLOCK
500: BATTERY

40: FULL-WAVE RECTIFIER
60: COMPARATOR
100: DETECTION CIRCUIT
41: INPUT SIGNAL
56: INTEGRATING CIRCUIT 20, 20' : CURRENT SOURCE WITH NO TEMPERATURE COEFFICIENT
40A: FULL-WAVE RECTIFIER
60: COMPARATOR
75A: REFERENCE VOLTAGE GENERATION CIRCUIT
80: PROPORTIONAL TO VBE CURRENT GENERATION CIRCUIT
90: CURRENT MIRROR CIRCUIT
100B: DETECTION CIRCUIT
41: INPUT SIGNAL
56: INTEGRATING CIRCUIT

61: COMPARATIVE VOLTAGE INPUT
63: DETECTION OUTPUT

40B: FULL-WAVE RECTIFIER
41: INPUT SIGNAL
42: CONSTANT VOLTAGE
56: INTEGRATING CIRCUIT

ALTERNATING CURRENT LEVEL DETECTION CIRCUIT

CROSS-REFERENCE TO RELATED APPLICATIONS

This application is based upon and claims the benefit of priority from the prior Japanese Patent Application No. 2008-186264, filed Jul. 17, 2008, the entire contents of which are incorporated herein by reference.

BACKGROUND OF THE INVENTION

1. Field of the Invention

The present invention relates to a detection circuit subjected to temperature compensation for eliminating erroneous detection caused by a temperature coefficient when magnitude of an alternating current signal is detected using a comparator.

2. Description of the Related Art

Conventionally, for example, in connection with a base unit and a handset in a cordless telephone, at the time of telephone conversation using the handset, the farther the handset moves away from the base unit, the more difficult it is to hear voice, and when a human voice reaches the same level as that of the surrounding noise, the handset is in a so-called out-of-service area. Under this condition, battery power is only consumed, and therefore the handset is controlled to stop outputting voice.

For this reason, a noise detection circuit is provided in the handset to extract, using a bandpass filter, a signal having a frequency around 20 kHz, which is the highest in an audible range, from audio signals having frequency of several kHz. The extracted signal as a noise signal is rectified and smoothed, the resultant is converted into a direct current voltage, and the direct current voltage is compared with a reference voltage. As a result, when the level of the direct current voltage is larger than that of the reference voltage, it is determined that the amount of noise is large, and a voice call is interrupted.

In such a noise detection circuit, when a noise signal is extracted, and voltage obtained by DC-converting the extracted signal is compared with the reference voltage to detect magnitude of the noise, a detection circuit subjected to temperature compensation must be used to prevent occurrence of erroneous noise determination.

As a conventional circuit subjected to temperature compensation, there is disclosed a constant current circuit as shown in, for example, Patent Document 1 (Japanese Patent Laid-Open No. 2001-142552).

Patent Document 1 describes the constant current circuit in which temperature coefficient of an output current Io is set to 0, but does not describe at all that magnitude of a signal level with respect to a reference level is detected by use of a comparator.

In order to achieve a temperature-independent noise detection circuit, there is need to reduce to zero a temperature coefficient of the direct current voltage as one input of the comparator and a temperature coefficient of the reference voltage as the other input of the comparator. For achieving this, used is at least one of two types of current sources including a current source (hereinafter referred to as a VT proportional current source) that is proportional to voltage proportional to temperature (hereinafter referred to as VT), and a current source (hereinafter referred to as a current source with no temperature coefficient) that does not depend on temperature generated by use of the VT proportional current source. Here, a case is considered in which two types of current sources are used in performing temperature compensation.

In a general circuit design, used is, rather than a system where current is generated in each circuit block in order to reduce the circuit scale, a system where current is generated in a current source block at one time and the generated current is distributed to each circuit block therefrom. In this case, if a plurality of current sources are needed, a plurality of distribution passages are required, thus raising a problem that a wiring region is increased. For this reason, there is considered a detection circuit subjected to temperature compensation with one current source. Accordingly, for achieving temperature compensation with one current source, the VT proportional current source is generally used to newly form a circuit that generates temperature independent current.

However, when two voltages with no temperature coefficient are generated and then compared with each other as mentioned above, a problem occurs in which the number of elements is increased due to newly prepared current generation circuit that does not depend on temperature.

BRIEF SUMMARY OF THE INVENTION

According to one aspect of the present invention, there is provided a detection circuit including a current source with no temperature coefficient; a current generation circuit that generates a VBE proportional reference current from the current source with no temperature coefficient; a current mirror circuit that returns an output current of the current generation circuit; a reference voltage generation circuit that generates a VBE proportional voltage with a negative temperature coefficient on the basis of the current returned by the current mirror circuit so that the VBE proportional voltage is used as a reference voltage of a comparator; and a full-wave rectifying means, having a differential pair and a rectifier circuit, using the current source with no temperature coefficient, having an alternating current signal supplied as an input signal, for generating a direct current voltage with a negative coefficient on the basis of a voltage obtained by full-wave rectifying the alternating current signal, and for using the generated voltage as a comparative voltage of the comparator.

DETAILED DESCRIPTION OF THE INVENTION

First Embodiment

A first embodiment of the present invention will be explained with reference to FIGS. 1 to 4.

Figure 1:
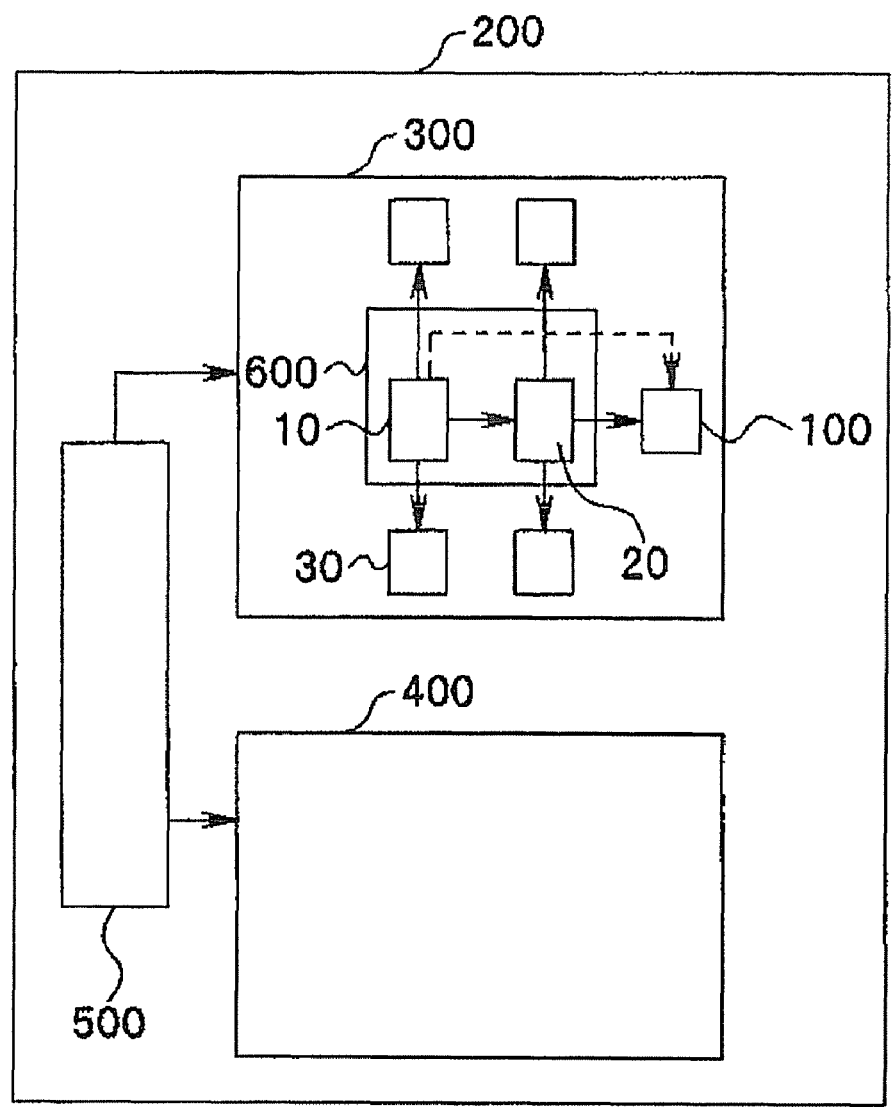
FIG. 1 shows a configuration view explaining a current source block used in a voice IC in a cordless telephone handset.

FIG. 1 shows a configuration view explaining a current source block used in a voice IC in a cordless telephone handset.

In FIG. 1, a handset 200 includes a voice IC 300 for receiving, transmitting, and outputting audio signals, a display IC 400 for displaying characters, marks and the like on a display section, which is not shown, and a battery 500 formed of a rechargeable battery and the like for supplying power to these ICs.

The voice IC 300 includes a current source block 600, a plurality of circuit blocks 30, and a detection circuit 100. The current source block 600 operates at a power supply voltage (for example 3V) from the battery 500. The plurality of circuit blocks 30 operate using at least one of two current sources 10 and 20 in the current source block 600. The detection circuit 100 is one of the plurality of circuit blocks 30 and is subjected to temperature compensation to eliminate erroneous detection caused by a temperature coefficient when, for example, an alternating current signal (for example, noise signal) having a specific frequency spectrum extracted from an audio signal using a bandpass filter in advance is compared with a reference level to detect magnitude of the noise signal. The plurality of circuit blocks 30 includes, for example, a frequency conversion circuit block, an amplifier circuit block in addition to the detection circuit. When the detection circuit 100 detects presence of a noise signal, a control section, which is not shown, controls the output of the audio signal so that the output is stopped based on the detected signal.

The current source block 600 includes a VT proportional current source 10 that generates current proportional to temperature and a current source 20, with no temperature coefficient, that generates a temperature independent current by use of the temperature proportional current generated by the VT proportional current source 10. It should be noted that the VT proportional current source has a positive temperature coefficient.

In the plurality of circuit blocks including the detection circuit 100, either one or both of the VT proportional current source 10 and the current source 20 with no temperature coefficient are used according to usage (necessity) in each circuit block.

Figure 2:
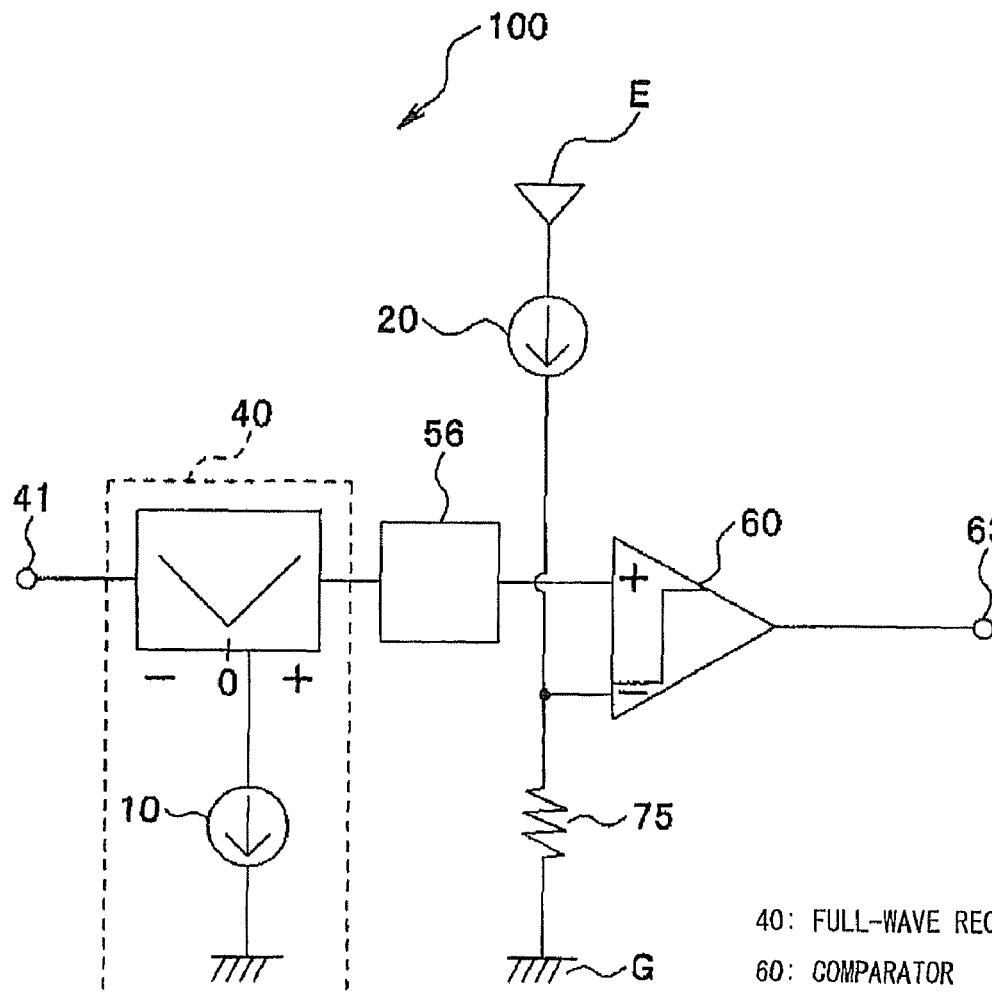
FIG. 2 is a block diagram showing a configuration example of a detection circuit subjected to temperature compensation of the relevant technique.

FIG. 2 shows an example of the configuration of the detection circuit 100 subjected to temperature compensation using two current sources. In the following detection circuit, a symbol G represents a first common potential point at which a reference potential is supplied and E represents a second common potential point at which, for example, a high potential (power voltage) is supplied from the battery 500.

The detection circuit 100 is configured in such a way that an input signal as an alternating current signal is rectified by a full-wave rectifier 40 and the resultant signal is further smoothed by an integrating circuit 56 to obtain a direct current voltage, and the direct current voltage and the reference voltage are compared with each other by a comparator 60 to thereby determine magnitude of the alternating current signal to be inputted.

The comparator 60 smoothes an output of the full-wave rectifier 40 to obtain a comparative voltage and compares the comparative voltage with the reference voltage to detect the magnitude, but it is required to reduce to zero two temperature coefficients: a coefficient of the direct current voltage obtained by DC-converting the input signal with the full-wave rectifier 40 and a coefficient of the reference voltage of the comparator 60, for the purpose of temperature compensation.

The full-wave rectifier 40 uses an emitter coupler (differential pair) as an amplifier having a pair of bipolar transistors, and the VT proportional current source 10 of the external current source block 600 (see FIG. 1) is drawn to a tail current source of the differential pair so as to provide a gain having no temperature coefficient to an output with respective to an input, thus resulting in elimination of the temperature coefficient of the output of the full-wave rectifier 40. As is known, an output voltage of the differential pair having the pair of bipolar transistors has a negative temperature coefficient.

Regarding the reference voltage of the comparator 60, the current source 20 having no temperature coefficient of the external current source block 600 (see FIG. 1) is drawn and its current is made to flow into a resistor 75 to thereby generate voltage and obtain a reference voltage having no temperature coefficient.

In the detection circuit as shown in FIG. 2, two types of external current sources 10 and 20 must be used to perform temperature compensation.

In a general circuit design, used is, rather than a system where current is generated in each circuit block in order to reduce the circuit scale, a system where current is generated in a current source block at one time and the generated current is distributed to each circuit block therefrom. In this case, if a plurality of current sources are needed, a plurality of distribution passages are required, thus raising a problem that a wiring region is increased. For this reason, there is considered a detection circuit subjected to temperature compensation with one current source.

Figure 3:
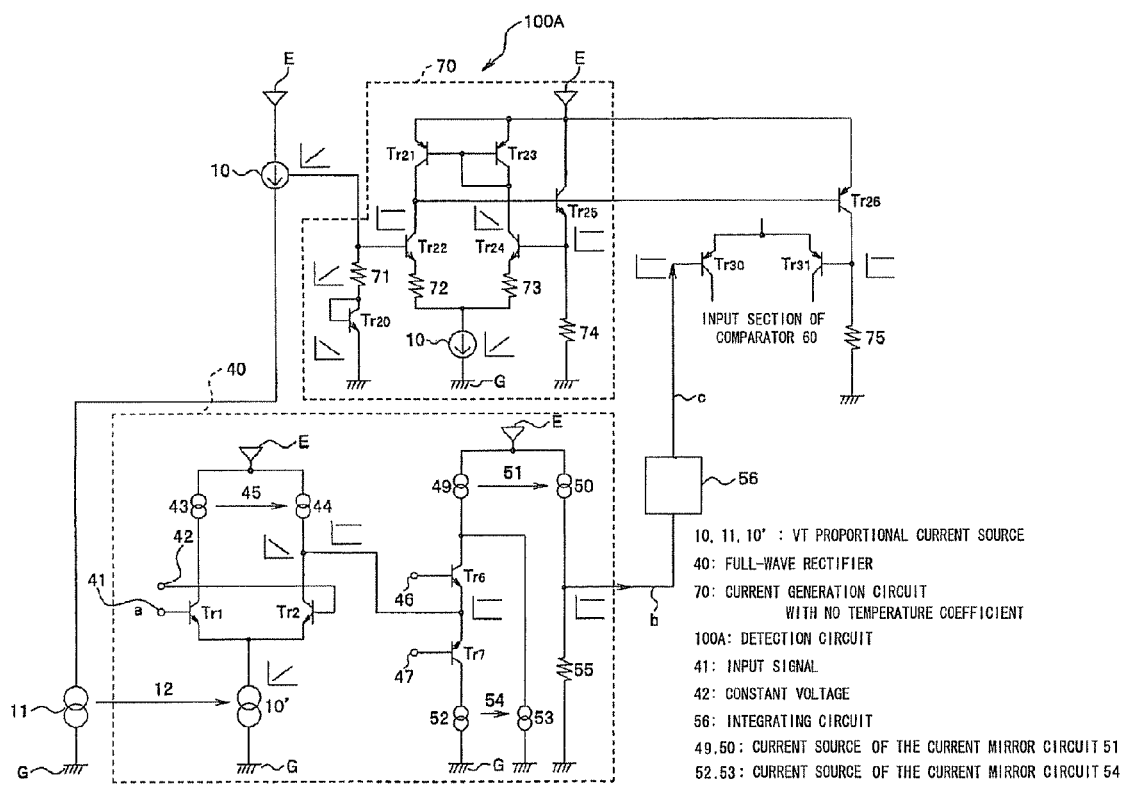
FIG. 3 is a block diagram showing a configuration example of the detection circuit subjected to temperature compensation of the relevant technique using one external current source.

FIG. 3 shows an example of the configuration of the detection circuit 100 when the same temperature compensation is performed with one current source. In addition, each of "/", "\" and "-" shown in the respective portions in FIG. 3 represents an inclination of a temperature coefficient where a horizontal axis is temperature and a vertical axis is an output voltage, and "/" represents a positive temperature coefficient, "\" represents a negative temperature coefficient, and "-" represents no temperature coefficient.

FIG. 3 shows a configuration similar to the configuration of the detection circuit subjected to temperature compensation in FIG. 2, that is, a configuration where a direct current voltage obtained by full-wave rectifying an input signal by the full-wave rectifier 40 is compared with a reference voltage of the comparator 60 to thereby detect magnitude of the signal level.

The comparator 60 compares a comparative voltage obtained by DC-converting the rectified voltage generated by the full-wave rectifier 40 on the basis of the current from the VT proportional current source 10 with a reference voltage generated by a current generation circuit 70 and reference voltage generating means (transistor Tr 26 and resistor R75) on the basis of the current from the VT proportional current source 10 to detect the magnitude. However, the comparator 60 is required to reduce to zero both temperature coefficients: a coefficient of a direct current voltage based on an output of the full-wave rectifier 40 as two inputs of the comparator 60 and a coefficient of a reference voltage generated at both terminals of the resistor 75, for the purpose of temperature compensation.

The full-wave rectifier 40 uses an emitter coupler (differential pair) having a pair of bipolar transistors as an amplifier, and an output voltage of the differential pair has a negative temperature coefficient, and the VT proportional current source 10 of the external current source block 600 (see FIG. 1) is drawn to a tail current source of the differential pair by a current mirror circuit so as to provide a gain having no temperature coefficient to an output with respective to an input, thus resulting in elimination of the temperature coefficient of the output of the full-wave rectifier 40.

Figure 4:
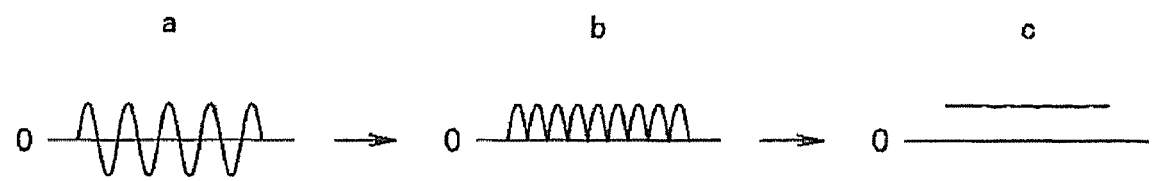
FIG. 4 is a view showing input and output waveforms of a full-wave rectifier and an integrating circuit.

Regarding the schematic operation of the full-wave rectifier 40, as shown in FIG. 4, an alternating current signal a as an input signal is inputted to an input terminal 41, a full-wave rectification signal as an output signal b of the full rectifier 40 is outputted, and the resultant signal is smoothed by the integrating circuit 56 and the resultant signal as a direct current signal c for supplying a direct current voltage is supplied to one input portion of the comparator 60. This makes it possible to obtain the direct current signal c corresponding to amplitude of the alternating current signal a.

The full-wave rectifier 40 includes a differential pair having transistors Tr 1, Tr 2, a current mirror circuit 45 and a tail current source with no temperature coefficient, and a rectifier circuit having transistors Tr 6, Tr 7, current mirror circuits 51, 54, and a resistor 55, but the detailed operation will be explained in FIG. 6.

On the other hand, in the current generation circuit 70 that generates a reference current with no temperature coefficient on the basis of the VT proportional current source 10, a base-emitter voltage VBE due to diode connection of a transistor Tr 20 is generated at a base of a transistor Tr 22 using the VT proportional current source 10 as the tail current source of the differential pair of the full-wave rectifier 40. A composite voltage, which is a sum of the base-emitter voltage VBE and a VT proportional voltage flowing into a resistor 71, is delivered to a base voltage of a transistor Tr 24 with the same potential by a differential pair, which includes transistors Tr 21, Tr22 and a resistor 72 and transistors Tr 23, Tr 24 and a resistor 73 and which uses the VT proportion current source 10 as the tail current source. The voltage is applied to a resistor 74, thereby generating current with no temperature coefficient that makes a reference voltage of the comparator 60.

The reference voltage of the comparator 60 is generated as voltage with no temperature coefficient by making the generated current with no temperature coefficient flow into the resistor 75 for generating a reference voltage with transistors Tr25 and Tr 26 serving as a current source of a common base.

As mentioned above, the first embodiment is a configuration example that implements temperature compensation using one current source 10. Namely, in order to reduce to zero the temperature coefficient of the output of the full-wave rectifier 40 and that of the reference voltage of the comparator 60, a current generation circuit 70 with no temperature coefficient is newly formed in a detection circuit 100A using the VT proportional current source 10, thereby eliminating the temperature coefficient of the reference voltage of the comparator 60.

Second Embodiment

An explanation will be next given of a second embodiment of the present invention with reference to FIGS. 5 to 8.

Figure 5:
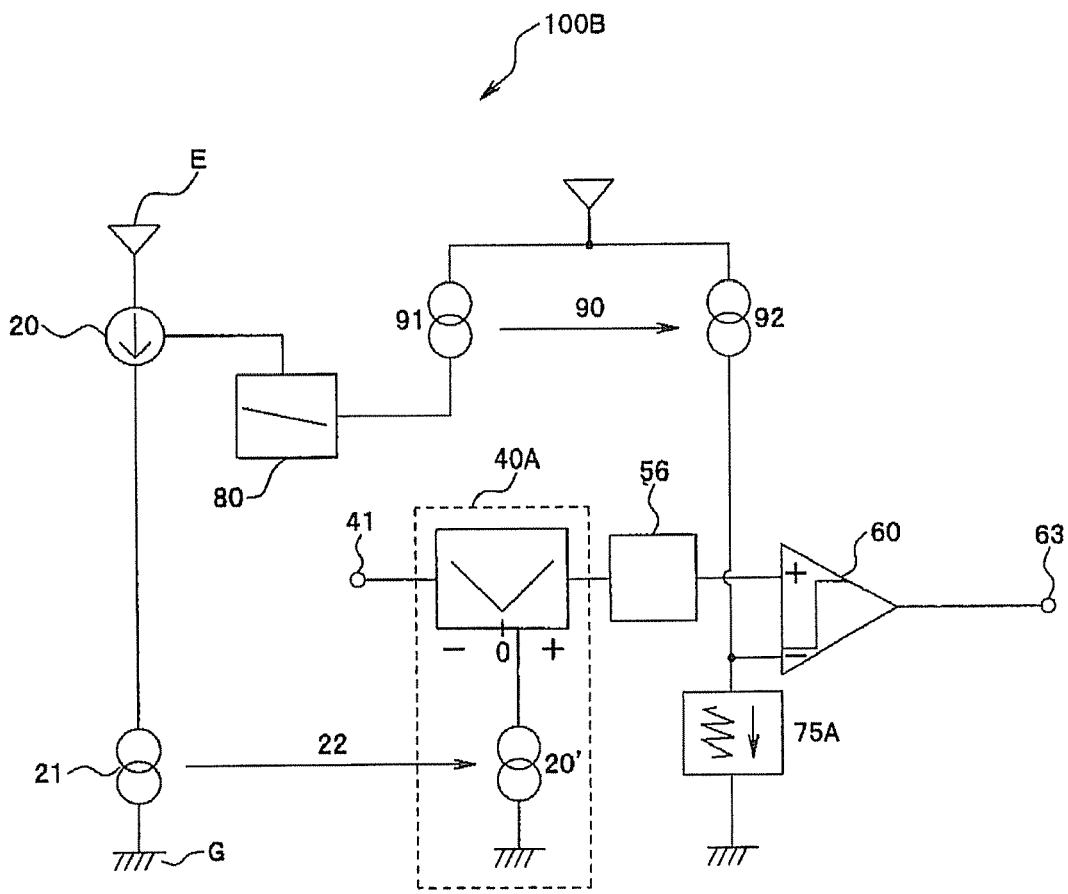
FIG. 5 is a block diagram showing the detection circuit of one embodiment of the present invention.

FIG. 5 is a block diagram showing one example of a configuration of a detection circuit of one embodiment of the present invention. The explanation will be given where the parts in FIGS. 5 to 8 common to those in FIGS. 1 to 3 are assigned the same reference numerals as those in FIGS. 1 to 3.

In FIG. 5, a detection circuit 100B includes a current source 20 with no temperature coefficient of an external current source block 600 (see FIG. 1) and a VBE proportional current generation circuit 80, a current mirror circuit 90, a reference voltage generation circuit 75A, a full-wave rectifier 40A, an integrating circuit 56, and a comparator 60.

The current source 20 with no temperature coefficient of the external current source block 600 (see FIG. 1) is connected to the VBE proportional current generation circuit 80 and a current source 20' with no temperature coefficient, which forms a tail current source of a differential pair of the full-wave rectifier 40A, through a current source 21 connected in series to the current source 20 with no temperature coefficient and a current mirror circuit 22. Here, the current source 20', which forms the tail current source of the differential pair, is drawn from the external current source 20 with no temperature coefficient by use of the current mirror circuit 22, and is substantially the same as the current source 20 with no temperature coefficient of the external current source block 600 (see FIG. 1).

The VBE proportional current generation circuit 80 inputs current from the current source 20 with no temperature coefficient, includes at least one transistor and a resistor, and generates current proportional to a base-emitter voltage with a negative temperature coefficient of the transistor and outputs the generated current.

The VBE proportional current generation circuit 80 is connected to a current source 91 on the input side of the current mirror circuit 90 formed of the current sources 91 and 92, and the current source 92 on the output side of the current mirror circuit 90 is connected to the reference voltage generation circuit 75A formed of a resistor circuit. A single resistor or a composite resistor having a combination of a plurality of resistors may be used as the resistor circuit that forms the reference voltage generation circuit 75A. A reference voltage to be supplied to the reference voltage input terminal of the comparator 60 is generated by the reference voltage generation circuit 75A.

The full-wave rectifier 40A includes a differential pair having a pair of bipolar transistors and a rectifier circuit, inputs an alternating current signal (for example, high-frequency noise signal) from the input terminal 41 and full-wave rectifies the alternating current signal, and outputs the resultant signal. Then, the full-wave rectification output is smoothed (converted into a direct current) by an integrating circuit 56 of the next stage, and the resultant output as a comparison voltage is supplied to an comparative voltage input terminal of the comparator 60. In addition, the full-wave rectifier 40A and the integrating circuit 56 forms a full-wave rectifying means for converting an alternating current signal supplied as an input signal into a direct current according to its amplitude.

An operation of the detection circuit in FIG. 5 will be next explained.

The VBE proportional current generation circuit 80 uses the current source 20 with no temperature coefficient of the external current source block 600 (see FIG. 1) as the current source to generate a VBE proportional current and output the generated current to the current source 91 on the input side of the current mirror circuit 90. The VBE proportional current has a negative temperature coefficient. The VBE proportional current generation circuit 80 can generate a reference current with a negative temperature coefficient with the simple configuration using the small number of transistors and resistors.

The current mirror circuit 90 returns the current with a negative temperature coefficient outputted from the VBE proportional current generation circuit 80 to the output side current source 92, and outputs the current to the reference voltage generation circuit 75A connected to the output side current source 92.

The reference voltage generation circuit 75A makes the VBE proportional current returned by the current mirror circuit 90 flow into the resistor circuit, thereby generating a VBE proportional reference voltage with a negative temperature coefficient at a reference input terminal of the comparator 60.

In the full-wave rectifier 40A, in order to provide the negative temperature coefficient to the output with respect to the input, the current source 20', which is drawn from the external current source 20 with no temperature coefficient of the external current source block 600 (see FIG. 1) by the current mirror circuit 22, is used as the tail current source of the differential pair. Then, a full-wave rectification output with a negative temperature coefficient is smoothed by the integrating circuit 56 in the differential pair, and the smoothed output is outputted as a comparative voltage that is one input of the comparator 60.

The comparator 60 compares the VBE proportional reference voltage with a negative temperature coefficient generated by the reference voltage generation circuit 75 with the input voltage with a negative temperature coefficient obtained by smoothing the output from the full-wave rectifier 40A, thereby outputting the comparison result as a digital logical value (high level or low level) with no temperature coefficient.

As mentioned above, according to the configuration shown in FIG. 5, in comparing the input level of the alternating current signal with the reference level, the structure is provided in which the direct current voltage with a negative coefficient corresponding to the alternating current signal inputted is compared with the VBE proportional reference voltage with a negative temperature coefficient, thereby making it possible to minimize the number of elements to be increased due to temperature compensation.

Figure 6:
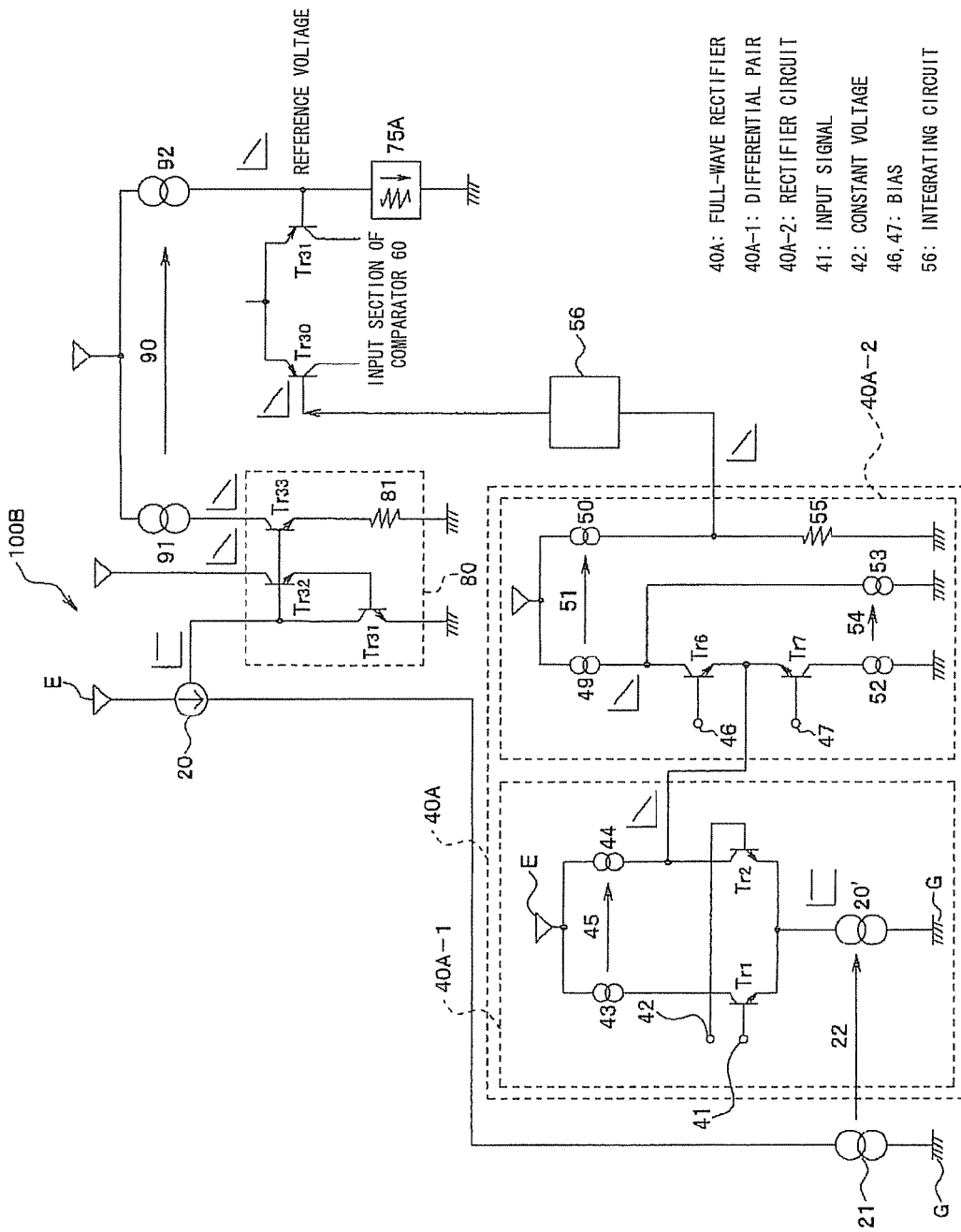
FIG. 6 is a circuit diagram showing a configuration example in FIG. 5.

FIG. 6 is a circuit diagram showing a configuration example in FIG. 5. This shows an example of the detection circuit where the functions of the VBE proportional current generation circuit 80 and the full-wave rectifier 40A explained in FIG. 5 are more specifically illustrated. In addition, each of "/", "\" and "-" shown in the respective portions in FIG. 6 represent an inclination of temperature coefficient where a horizontal axis is temperature and a vertical axis is an output voltage, and "/" shows a positive temperature coefficient, "\" is a negative temperature coefficient, and "-" shows no temperature coefficient.

Similarly to FIG. 5, the detection circuit 100B includes a current source 20 with no temperature coefficient of the external current source block 600 (see FIG. 1) and a VBE proportional current generation circuit 80, a current mirror circuit 90, a reference voltage generation circuit 75A, a full-wave rectifier 40A, and a comparator 60. The full-wave rectifier 40A has the same circuit configuration as that of the full-wave rectifier 40 in FIG. 3, but there is a difference therebetween in the point that the full-wave rectifier 40 in FIG. 3 obtains the full-wave rectification output with no temperature coefficient using the VT proportional current source 10, while the full-wave rectifier 40A obtains the full-wave rectification output with a negative temperature coefficient using the current source 20 with no temperature coefficient.

The VBE proportional current generation circuit 80 includes first to third transistors Tr 31, Tr 32, Tr33 and a resistor 81 in FIG. 6, and current from the current source 20 with no temperature coefficient flows between the base and emitter of each of the first to third transistors Tr 31, Tr 32, Tr33 to thereby generate a base-emitter voltage VBE, respectively. Therefore, potential of the base of the third transistor Tr 33 is a sum of the base-emitter voltage VBE of the first transistor Tr 31 and that of the second transistor Tr 32, namely, the potential is increased by an amount equivalent to two base-emitter voltages (2×VBE) from a first common potential point, and the base-emitter voltage VBE is applied to the resistor 81 between the emitter of the third transistor Tr 33 and the first common potential point. The base-emitter voltage VBE has a negative temperature coefficient, and therefore a VBE proportional current with a negative temperature coefficient flows into the resistor 81, resulting in an output current.

Similarly to FIG. 5, the current mirror circuit 90 returns the current with a negative temperature coefficient outputted from the VBE proportional current generation circuit 80 and outputs the current to the reference voltage generation circuit 75A. The reference voltage generation circuit 75A makes the VBE proportional current with a negative temperature coefficient returned by the current mirror circuit 90 flow into the resistor circuit as a load, thereby generating a VBE proportional reference voltage with a negative temperature coefficient at the reference input terminal of the comparator 60. A single resistor or a composite resistor having a combination of a plurality of resistors, or a configuration of a plurality of resistors connected in parallel or in series may be used as the resistor circuit.

The full-wave rectifier 40A includes a differential pair 40A-1 having transistors Tr 1, Tr 2, the current mirror circuit 45, and the tail current source 20', which is drawn from the external current source 20 with no temperature coefficient of the external current source block 600 (see FIG. 1), and a rectifier circuit 40A-2 having transistors Tr 6, Tr 7, current mirror circuits 51, 54, and a resistor 55.

A signal input to the differential pair 40A-1 from the input terminal 41 is converted into current by the transistor Tr 1, and the resultant current is outputted as a difference between current returned by the current mirror 45 and a corrector current of the transistor Tr 2 based on a constant voltage applied to the input terminal 42. The current source 20 with no temperature coefficient drawn to the tail current source 20' of the differential pair 40A-1 from an external section is used, and therefore current to be outputted to the input signal has a negative temperature coefficient in the differential pair 40A-1.

In the differential pair 40A-1, when the input signal is larger than the reference voltage (constant voltage), the current returned to the current source 44 from the current source 43 of the current mirror circuit 45 is larger than the collector current of the transistor Tr 2, with a result that current with a negative temperature coefficient flows from the differential pair 40A-1 to the rectifier circuit 40A-2. At this time, a potential difference between bias input terminals 46 and 47 is set to be equal to the base-emitter voltage VBE, and therefore when current flows into the emitter side of the transistor Tr 7, the emitter and the base of the transistor Tr 6 have the same potential as each other and the transistor Tr 6 does not operate. The output current with a negative temperature coefficient of the differential pair is returned by the current mirror circuit 54 and further returned by the current mirror circuit 51 again to be made to flow into the resistor 55, and the resultant current is outputted as an output current with a negative temperature coefficient.

Contrarily, when the input signal is smaller than the reference voltage, the current returned to the current source 44 from the current source 43 of the current mirror circuit 45 is smaller than the collector current of the transistor Tr 2, with a result that current with a negative temperature coefficient flows from the rectifier circuit 40A-2 to the differential pair 40A-1. At this time, a potential difference between bias input terminals 46 and 47 is set to be equal to the base-emitter voltage VBE, and therefore when current is drawn from the emitter side of the transistor Tr 6 and flows into the transistor Tr 6, the emitter and the base of the transistor Tr 7 have the same potential as each other and the transistor Tr 7 does not operate, the output current with a negative temperature coefficient of the differential pair is once returned by the current mirror circuit 51 and is made to flow into the resistor 55, and the resultant current is outputted as an output current with a negative temperature coefficient.

When the input signal is larger or smaller than the reference voltage, current flows into the resistor 55 of the output terminal of the rectifier circuit 40A-2 in the same direction, and therefore the input signal is full-wave rectified and receives a negative temperature coefficient of the differential pair 40A-1, so that an output voltage of the full-wave rectification, which is generated in the resistor 55, also has a negative temperature coefficient.

Similarly to FIG. 5, the comparator 60 compares the VBE proportional reference voltage with a negative temperature coefficient generated by the reference voltage generation circuit 75A with the input voltage with a negative temperature coefficient, which is outputted from the full-wave rectifier 40A and which is smoothed by an integrating circuit 56, thereby canceling the temperature coefficients each other to obtain a detection output with no temperature coefficient.

Though the resistor 81 and the reference voltage generation circuit 75A, which are respectively connected to the current sources 91 and 92 that form the current mirror circuit 90, have temperature coefficients, both temperature coefficients are negated each other in their circuit configuration, and therefore the temperature coefficient due to resistor is neglected.

For achieving temperature compensation with one current source, in order to reduce to zero the temperature coefficient of the output of the full-wave rectifier and that of the reference voltage of the comparator, a temperature independent current source must be newly prepared using the VT proportional current source to reduce to zero the temperature coefficient of the reference voltage of the comparator in the detection circuit 100A in FIG. 3. In this case, there is a problem in which the number of elements is increased due to the newly prepared temperature independent current source 70 (see FIG. 3). However, in the embodiment of the present invention shown in FIG. 6, it is possible to minimize the number of elements increased due to temperature compensation by use of the newly prepared VBE proportional current generation circuit 80 with a negative temperature coefficient.

Figure 7:
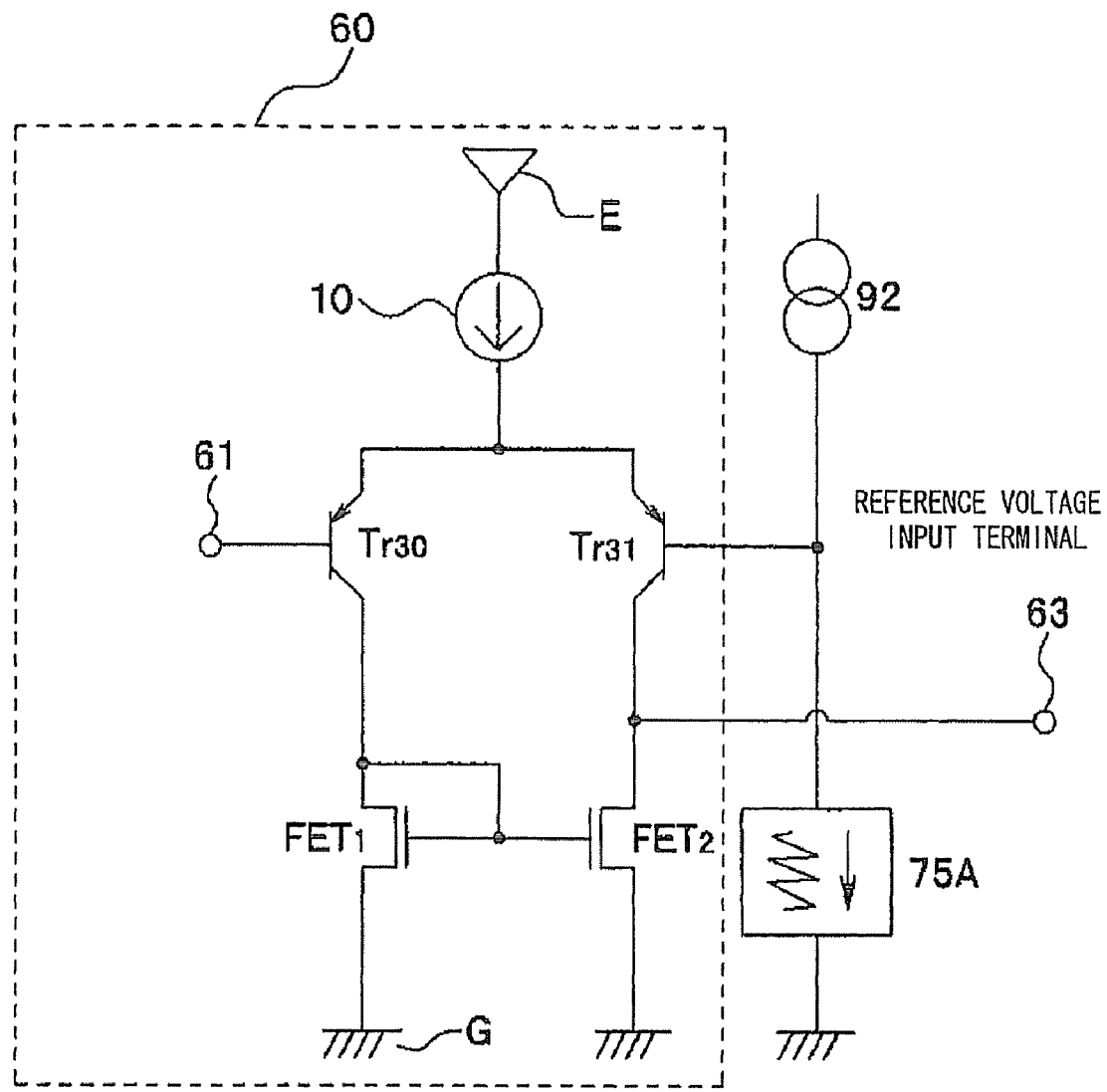
FIG. 7 is a circuit diagram showing a configuration example of a comparator in FIG. 6.

FIG. 7 is a circuit diagram showing a configuration example of the comparator in FIG. 6.

In FIG. 7, the comparator 60 includes a VT proportional current source 10, a pair of PNP type bipolar transistors Tr 30 and Tr 31 that form a differential pair, and two field-effect transistors FET 1 and FET 2 that form a current mirror circuit. A comparative voltage with a negative temperature coefficient is inputted to an input terminal 61 of the transistor Tr 30 from the full-wave rectifying means, and the reference voltage generated by the reference voltage generation circuit 75A is inputted to the base of the transistor Tr 31. When the comparative voltage inputted to the input terminal 61 is larger than the reference voltage inputted to the base of the transistor Tr 31, the difference therebetween is immediately amplified to output a high level signal from an output terminal 63 connected to the emitter of the transistor Tr 31, and when the comparative voltage equals to or less than the reference voltage, a low level signal is outputted from the output terminal 63.

Figure 8:
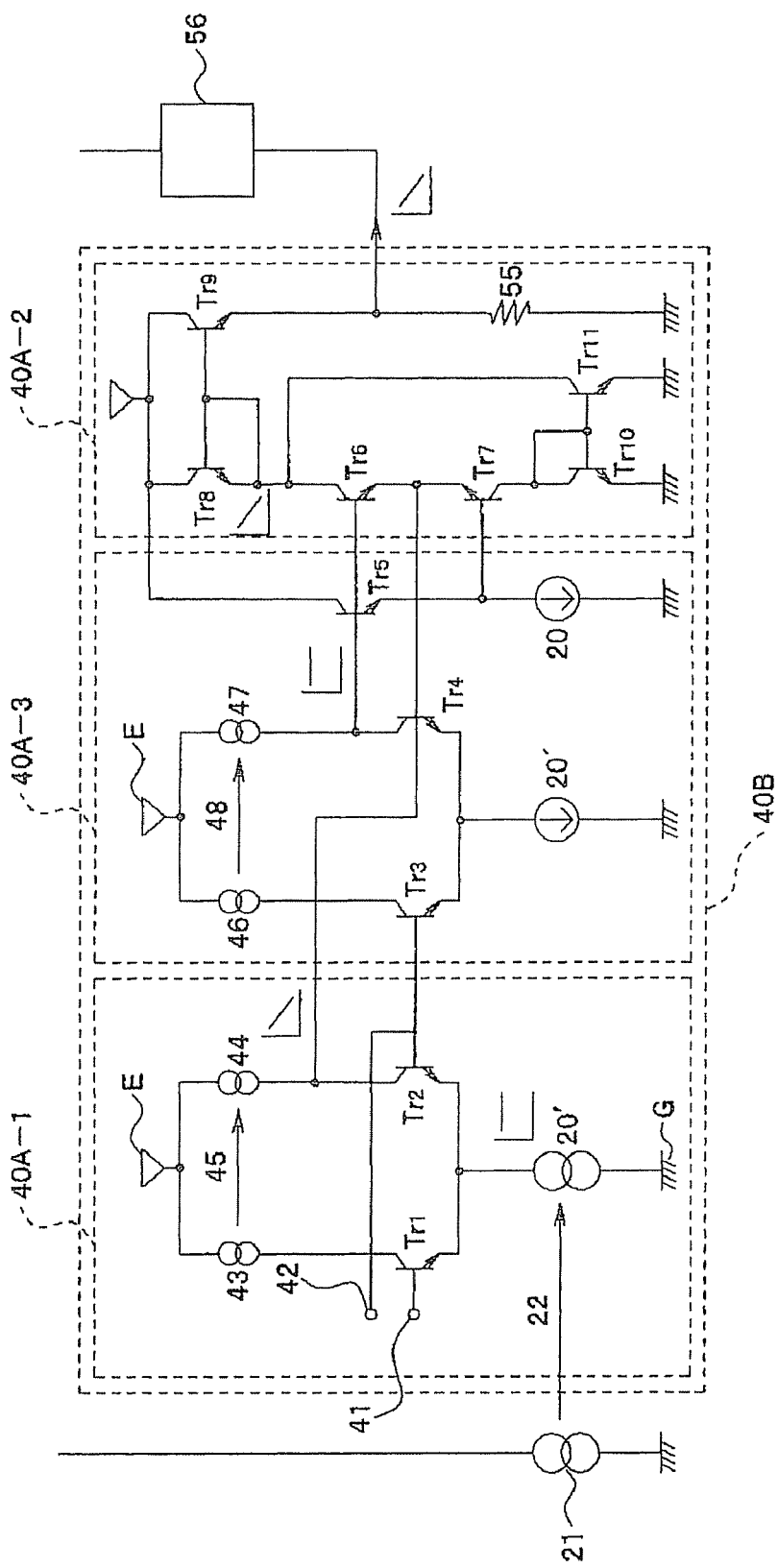
FIG. 8 is a circuit diagram showing a configuration example of the full-wave rectifier in FIG. 6.

FIG. 8 is a circuit diagram showing a configuration example of the full-wave rectifier in FIG. 6. The explanation will be given where the parts in FIG. 8 common to those of the full-wave rectifier 40A in FIG. 6 are assigned the same reference numerals as those in FIG. 6.

In FIG. 8, a full-wave rectifier 40B is configured to have a bias generation circuit 40A-3 between the differential pair 40A-1 and the rectifier circuit 40A-2 shown in FIG. 6. The bias generation circuit 40A-3 includes a pair of bipolar transistors Tr 3, Tr 4 to which a common emitter is connected, a current mirror circuit 48 having current sources 46 and 47 connected to the respective collectors of the transistors Tr 3, Tr 4, a tail current source 20' connected to the common emitter of the transistors Tr 3, Tr 4, a transistor Tr 5 having a collector to which power voltage E is added and a base to which a collector current of the transistor Tr 4 is supplied, and a current source 20 connected in series to an emitter of the transistor Tr 5. The tail current source 20' uses, for example, a current source 21, of the differential pair 40A-1, returned by a current mirror circuit (not shown).

The bias generation circuit 40A-3 has a function of generating bias necessary for the bias input terminals 46 and 47 of the rectifier circuit 40A-2 shown in FIG. 6.

In addition, transistors Tr 8 and Tr 9 of the rectifier circuit 40A-2 forms the current mirror circuit 51 of the rectifier circuit 40A-2 in FIG. 6, and transistors Tr 10 and Tr 11 of the rectifier circuit 40A-2 forms the current mirror circuit 54 of the rectifier circuit 40A-2 in FIG. 6.

In the second embodiment, the number of circuit elements is reduced by the number of circuit elements corresponding to the current generation circuit 70 with no temperature coefficient as compared with the first embodiment. Accordingly, in the second embodiment, temperature compensation can be achieved with the small number of circuit elements as compared with the first embodiment.

In addition, the present invention can be widely used in apparatus, circuits and system in which detecting magnitude of the alternating current signal level is necessary, without limiting to the noise detection circuit. For example, when an input signal is absent or too weak for a fixed period of time during the use of a personal computer, the present invention can be implemented to a detection circuit that detects the input signal and changes a screen to a power saving mode.

What is claimed is:

1. A detection circuit comprising:
   a current source with no temperature coefficient;
   a current generation circuit that generates a VBE proportional reference current from the current source with no temperature coefficient;
   a first current mirror circuit that returns an output current of the current generation circuit;
   a reference voltage generation circuit that generates a VBE proportional voltage with a negative temperature coefficient on the basis of the current returned by the first current mirror circuit so that the VBE proportional voltage is used as a reference voltage of a comparator; and
   full-wave rectifying means, having a differential pair and a rectifier circuit, using the current source with no temperature coefficient, having an alternating current signal supplied thereto as an input signal, for generating a direct current voltage with a negative temperature coefficient on the basis of a voltage obtained by full-wave rectifying the alternating current signal, and for using the generated voltage as a comparative voltage of the comparator.

2. The detection circuit according to claim 1, wherein the current generation circuit includes:
a first transistor having a collector connected to an output terminal of the current source with no temperature coefficient, and an emitter connected to a first common potential point as a reference potential;
a second transistor having a base connected to the output terminal of the current source with no temperature coefficient, an emitter connected to a base of the first transistor, and a collector connected to a second common potential point as a high potential; and
a third transistor having a base connected to the output terminal of the current source with no temperature coefficient, an emitter connected to the first common potential point through a resistor, and a collector connected to an input side current source of the first current mirror circuit.

3. The detection circuit according to claim 1, wherein the full-wave rectifying means includes:
the differential pair having a pair of bipolar transistors to which a common emitter is connected, a tail current source using the current source with no temperature coefficient connected to the common emitter, and a second current mirror circuit formed between collectors of the bipolar transistors,
the alternating current signal as the input signal being supplied to a base of a first one of the transistors,
a constant voltage being supplied to a base of a second one of the transistors,
the signal inputted to the base of each of the pair of transistors being converted into a current, and
the differential pair outputting a current with the negative temperature coefficient as a difference between the current returned by the second current mirror circuit and a collector current of the second one of the transistors; and
the rectifier circuit that full-wave rectifies an output of the differential current, and
wherein the full-wave rectifying means generates the direct current voltage with the negative temperature coefficient on the basis of a full-wave rectification voltage obtained by the rectifier circuit.

4. The detection circuit according to claim 3, wherein the current generation circuit includes:
a first transistor having a collector connected to an output terminal of the current source with no temperature coefficient, and an emitter connected to a first common potential point as a reference potential;
a second transistor having a base connected to the output terminal of the current source with no temperature coefficient, an emitter connected to a base of the first transistor, and a collector connected to a second common potential point as a high potential; and
a third transistor having a base connected to the output terminal of the current source with no temperature coefficient, an emitter connected to the first common potential point through a resistor, and a collector connected to an input side current source of the first current mirror circuit.

5. The detection circuit according to claim 1, wherein the reference voltage generation circuit is formed of a resistor circuit connected between a first common potential point as a reference potential and a return current output terminal of an output side current source of the first current mirror circuit, and
a connection point of the return current output terminal and the resistor circuit is connected to a reference voltage input terminal of the comparator.

6. The detection circuit according to claim 2, wherein the reference voltage generation circuit is formed of a resistor circuit connected between the first common potential point and a return current output terminal of an output side current source of the first current mirror circuit, and
a connection point of the return current output terminal and the resistor circuit is connected to a reference voltage input terminal of the comparator.

7. The detection circuit according to claim 3, wherein the reference voltage generation circuit is formed of a resistor circuit connected between a first common potential point as a reference potential and a return current output terminal of an output side current source of the first current mirror circuit, and
a connection point of the return current output terminal and the resistor circuit is connected to a reference voltage input terminal of the comparator.

8. The detection circuit according to claim 4, wherein the reference voltage generation circuit is formed of a resistor circuit connected between the first common potential point and a return current output terminal of an output side current source of the first current mirror circuit, and
a connection point of the return current output terminal and the resistor circuit is connected to a reference voltage input terminal of the comparator.

* * * * *